United States Patent
Chaudhary et al.

(10) Patent No.: US 8,495,525 B1
(45) Date of Patent: Jul. 23, 2013

(54) LITHOGRAPHIC ERROR REDUCTION BY PATTERN MATCHING

(75) Inventors: Aditya Chaudhary, Bangalore (IN); Pierre J. Bouchard, South Burlington, VT (US); Kalpesh G. Dave, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/424,816

(22) Filed: Mar. 20, 2012

(51) Int. Cl.
*G06F 17/50* (2006.01)

(52) U.S. Cl.
USPC .............................. 716/51; 716/52; 716/112

(58) Field of Classification Search
USPC .............................. 716/51, 52, 112
See application file for complete search history.

(56) References Cited

U.S. PATENT DOCUMENTS

| | | | |
|---|---|---|---|
| 7,570,796 B2 | 8/2009 | Zafar et al. | |
| 7,685,558 B2 | 3/2010 | Lai et al. | |
| 7,689,948 B1 | 3/2010 | White et al. | |
| 7,694,244 B2 | 4/2010 | Chan et al. | |
| 7,725,845 B1 | 5/2010 | White et al. | |
| 7,954,072 B2 | 5/2011 | Liu et al. | |
| 7,958,463 B2 | 6/2011 | Ikeuchi | |
| 7,979,812 B2 | 7/2011 | Jung et al. | |
| 2009/0214103 A1* | 8/2009 | Tanaka et al. | 382/145 |
| 2009/0268956 A1 | 10/2009 | Wiley | |
| 2009/0300561 A1 | 12/2009 | Tong et al. | |
| 2010/0324878 A1 | 12/2010 | Lee et al. | |
| 2012/0198393 A1* | 8/2012 | Taoka | 716/51 |

FOREIGN PATENT DOCUMENTS

| | | |
|---|---|---|
| CN | 101894178 A | 11/2010 |
| WO | 2009131775 A1 | 10/2009 |

OTHER PUBLICATIONS

Vasek, J. et al., "Using Design Intent to Qualify and Control Lithography for Manufacturing" Proceedings of SPIE (Jan. 2006) pp. 1-5, vol. 6156.
Shim, Y. et al., "Improvement on OPC Completeness Through Pre-OPC Hot Spot Detection and Fix" Proceedings of SPIE (Apr. 2008) pp. 692513-1-692513-8, vol. 6925.
Wong, A.K.K. et al., "The Nebulous Hotspot and Algorithm Variability" Proceedings of SPIE (Mar. 2009) pp. 727509-1-727509-9, vol. 7275.
Yao, H. et al., "Efficient Process-Hotspot Detection Using Range Pattern Matching" ICCAD (Nov. 5-9, 2006) pp. 625-632.
Roseboom, E. et al., "Automated Full-Chip Hotspot Detection and Removal Flow for Interconnect Layers of cell-Based Designs" SPIE Advanced Lithography (Feb. 2007) pp. 1-9, vol. 6521.

* cited by examiner

*Primary Examiner* — Vuthe Siek
(74) *Attorney, Agent, or Firm* — Scully, Scott, Murphy & Presser, P.C.; Parashos Kalaitzis, Esq.

(57) ABSTRACT

A library of waivable images with corresponding waiver constraints is generated. Each of the waivable images is an image of a region of a reference design layout including a raw error as determined by an optical rule checks (ORC) program and does not require a correction for printability on a photoresist layer. A list of raw errors is generated by running the ORC program on a target design layout. Error region images corresponding to the list of raw errors are generated by selecting a region of the target design layout around points corresponding to the raw errors. A list of matches between the library of waivable images and the error region images is generated. By removing a subset of raw errors that correspond to a subset of the list of matches from the list of raw errors, a list of real errors is generated.

20 Claims, 4 Drawing Sheets

LITHOGRAPHIC ERROR REDUCTION BY PATTERN MATCHING

BACKGROUND

The present disclosure relates to a method for reducing lithographic errors for manual processing by automatically removing errors that do not require pattern correction, and a system for effecting the same.

A combination of an optical proximity correction (OPC) program and an optical rule checks (ORC) program is employed to analyze a design layout for a semiconductor chip for lithographic errors. Typically, identification of lithographic errors is performed by running a verification recipe with the OPC program and/or the ORC program. The identified lithographic errors are collected in an error database.

The error base includes errors that ultimately require pattern corrections thereupon and errors that are associated portions of the pattern that can be lithographically printed safely, i.e., without causing yield or reliability issues, despite being identified as errors. The errors that require pattern corrections are referred to as real errors. The errors that are associated portions of the pattern that can be lithographically printed safely are referred to as waivers.

A persistent challenge in the verification of any design layout is to identify the waivers among the error database so that efforts to correct the design layout can be concentrated only on real errors. The difficulty of the challenge arises from the complexity of waiver patterns, i.e., the patterns for the waivers. Thus, describing the waivers employing a standard verification language becomes very tedious, and is prone to generating unexpected results. The waiver patterns have a dynamic nature, hence, updating all production verification recipes to waive non-critical patterns can consume many hours of intensive manual examination.

BRIEF SUMMARY

A library of waivable images with corresponding waiver constraints is generated. Each of the waivable images is an image of a region of a reference design layout including a raw error as determined by an optical rule checks (ORC) program and does not require a correction for printability on a photoresist layer. A list of raw errors is generated by running the ORC program on a target design layout. Error region images corresponding to the list of raw errors are generated by selecting a region of the target design layout around points corresponding to the raw errors. A list of matches between the library of waivable images and the error region images is generated. By removing a subset of raw errors that correspond to a subset of the list of matches from the list of raw errors, a list of real errors is generated.

According to an aspect of the present disclosure, a method for generating a list of real errors from a list of raw errors is provided. The method includes: generating a library of waivable images with corresponding waiver constraints. Each of the waivable images is an image of a region of a reference design layout including a raw error as determined by an optical rule checks (ORC) program and does not require a correction for printability on a photoresist layer. The method further includes: generating a list of raw errors by running the ORC program on a target design layout; generating error region images corresponding to the list of raw errors; generating a list of matches between the library of waivable images and the error region images; and removing a subset of raw errors that correspond to a subset of the list of matches from the list of raw errors to generate a list of real errors.

According to another aspect of the present disclosure, a system for generating a list of real errors from a list of raw errors is provided. The system includes: a data storage unit that stores a library of waivable images with corresponding waiver constraints; and a computing means in communication with the data storage unit and configured to accept as inputs a target design layout and a list of raw errors of the target design layout as generated by an optical rule checks (OPC) program, and configured to generate error region images corresponding to the list of raw errors, and configured to generate a list of matches between the library of waivable images and the error region images, and configured to remove a subset of raw errors that correspond to a subset of the list of matches from the list of raw errors, and configured to output, in a data storage medium, a list of real errors that is a difference between the list of raw errors and the subset of raw errors.

According to yet another aspect of the present disclosure, a non-transitory machine-readable data storage medium embodying a program for generating a list of real errors from a list of raw errors is provided. The program includes steps of: retrieving a library of waivable images with corresponding waiver constraints from a data storage unit; accepting as inputs a target design layout and a list of raw errors from the target design layout as generated by an optical proximity correction (OPC) program; generating error region images corresponding to the list of raw errors; generating a list of matches between the library of waivable images and the error region images; and removing a subset of raw errors that correspond to a subset of the list of matches from the list of raw errors to generate a list of real errors.

DETAILED DESCRIPTION

Figure 1:
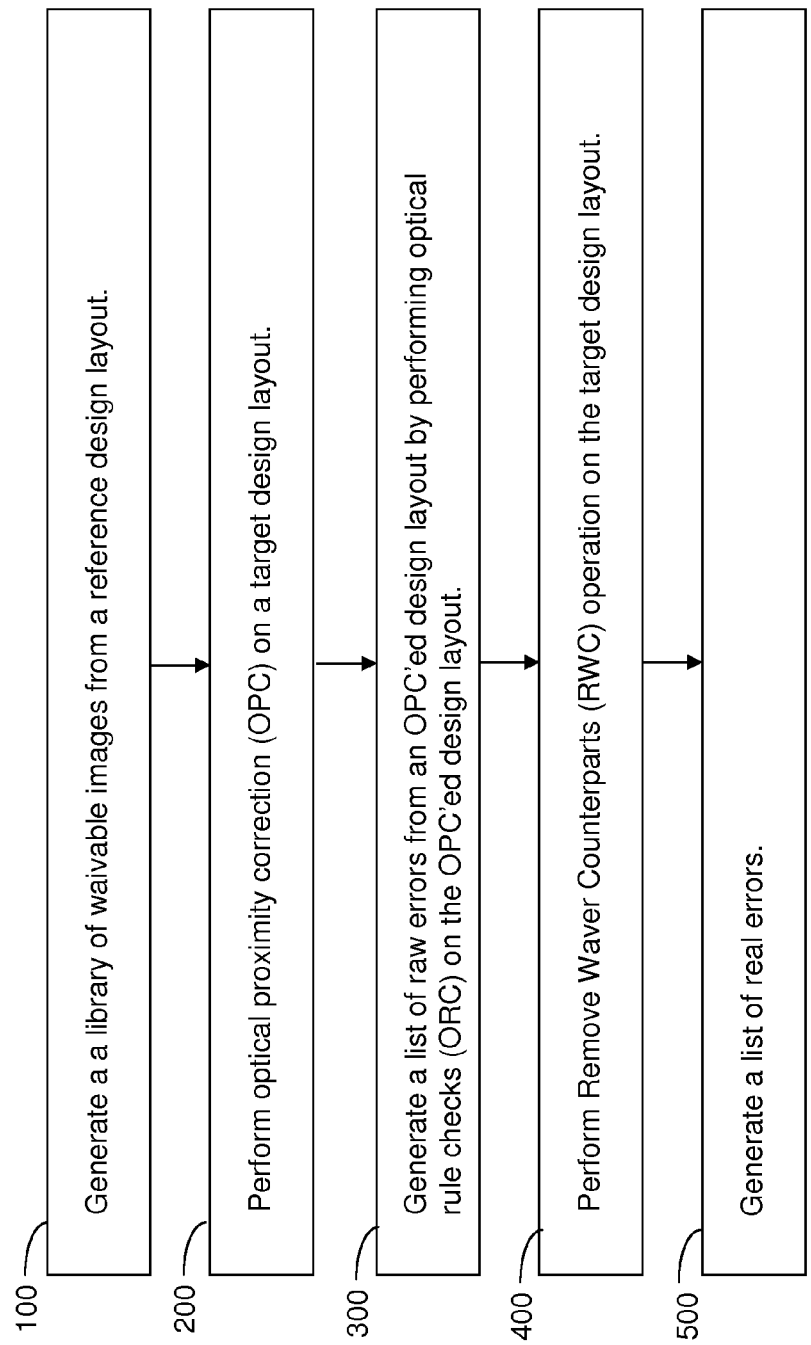
FIG. 1 is a flow chart illustrating the various steps for utilizing a method of the present disclosure.

As stated above, the present invention relates to a method for reducing lithographic errors for manual processing by automatically removing errors that do not require pattern correction, and a system for effecting the same, which are now described in detail with accompanying figures. It is noted that like and corresponding elements mentioned herein and illustrated in the drawings are referred to by like reference numerals.

Referring to FIG. 1, a flow chart including various steps illustrates the various steps for utilizing a method of the present disclosure.

Referring to step 100, a library of waivable images is generated from a reference design layout.

As used herein, a "design layout" refers to any dataset stored in any medium that represents a design for a structure, and includes design layouts for a semiconductor device, a set of semiconductor devices, or a semiconductor chip including a plurality of semiconductor devices as known in the art.

As used herein, an "image" is a set of data representing the configuration of a contiguous local region of a design layout as embodied in any format representing a two-dimensional image including all known graphic data formats.

As used herein, a "raw error" of a design layout is an incidence of violation of a design rule as detected by running an optical rule checks (ORC) program as known in the art on the design layout.

As used herein, a "waivable image" is an image of a region that includes a raw error as determined by an optical rule checks (ORC) program and does not require a correction for printability on a photoresist layer. It is understood that the determination on whether an image requires a correction or not for printability on a photoresist layer is made by one of ordinary skill in the art such as an engineer who works on lithographic image modification.

The determination that a raw error does not require any correction to any portion of a design layout can be made, for example, by printing a physical pattern in a photoresist layer of the region including the raw error and examining the physical features of the printed physical pattern in the photoresist layer. Alternately, determination that a raw error does not require any correction to any portion of a design layout can be made by manufacturing a semiconductor chip employing a mask that embodies the design layout and by verifying that the portion of the design layout associated with the raw error does not impact yield and/or reliability of manufactured semiconductor chips. Thus, identification of an image as a waivable image is performed by a verification process that employs physical reproduction of the portion of the design layout that corresponds to the image as a printed lithographic image in a photoresist layer, and subsequent examination of the quality of the printed lithographic image by direct visual examination thereupon or by indirect electrical examination on devices manufactured employing the printed lithographic image. Each waivable image includes a region of the design layout around a point or area associated with a raw error, and is less than an image of the entire design layout.

As used herein, a "reference" design layout is a design layout that is analyzed to detect at least one waivable image therefrom.

The library of waivable images is generated with corresponding waiver constraints.

As used herein, a "waiver constraint" is a parameter range or parameter ranges that can be varied within each waivable image while maintaining the waivability of that waivable image, i.e., without disqualifying that waivable image for excessive variation. A waiver constraint may include a single parameter range or multiple parameter ranges for corresponding multiple parameters. A corresponding waiver constraint includes at least one allowed modification to a set of design rules embodied in the ORC program that is employed to generate the library of waivable images.

For example, the at least one modification can include at least one of a minimum spacing between adjacent line shapes, a minimum width of a line shape, a minimum pattern factor within a predefined radius, a maximum spacing between adjacent line shapes, a maximum width of a line shape, and a maximum pattern factor within a predefined radius.

Referring to step 200, a target design layout is provided. As used herein, a "target layout design" refers to any design layout prior to performing optical proximity correction (OPC) that is to be subsequently examined for suitability for printing. Optical proximity correction (OPC) is performed to the target design layout to generate an OPC'ed design layout.

Any OPC program known in the art or to be developed in the future can be employed at this step. The target design layout can be different from the reference design layout, or can be the same as the reference design layout.

Referring to step 300, a list of raw errors is generated from the OPC'ed design layout by performing optical rule checks (ORC) on the OPC'ed design layout. The same OPC program as employed to generate the library of waivable images can be employed to generate the list of raw errors, from the OPC'ed design layout, which is derived from the target design layout by performed an OPC operation. The list of raw errors includes all errors that are flagged by the ORC program for violating a set of design rules embodied in the ORC program.

Referring to step 400, removable waiver counterparts (RWC) operation is performed to remove false errors from the list of raw errors. The set of remaining errors after removing all false errors from the list of raw errors is herein referred to as a set of real errors. Thus, "real errors" herein refer to a subset of raw errors that are not removed during the RWC operation, and "false errors" herein refer to a subset of raw errors that are removed during the RWC operation. The RWC operation can be performed automatically by an automated system employing a computing means. Further, a program for implementing the RWC operation can be embodied in a non-transitory machine-readable data storage medium such as a CD-ROM, a DVD-ROM, a flash drive, a hard disk, or any other solid state data storage device known in the art.

Referring to step 500, the set of real errors is output as a list of real errors. The number of real errors in the list of real errors can be significantly smaller than the number of raw errors. For example, the ratio of the number of real errors to the number of raw errors can be from 0.001 to 0.9, although lesser and greater ratios can also be employed. The real errors represent errors that are associated with regions of the target design layout that require modifications. Such modifications are typically performed manually by design engineers. By reducing the number of errors for design engineers to examine through filtering of false errors from the list of raw errors, design engineers can work only on real errors without the need to review the false errors. Thus, the method illustrated in the flow chart of FIG. 1 can enhance the efficiency of the step of checking the list of raw errors for identification or problem regions in the target design layout and remedial modifications to the target design layout.

As discussed above, RWC operation is performed at step 400 of FIG. 1. Component steps for step 400 of FIG. 1 are illustrated in detail in the flow chart of FIG. 2. During the RWC operation, the list of real errors is generated from the list of raw errors, which is generated at step 300 of FIG. 1.

Input data 402 and input data 404 are provided as inputs for step 410. Input data 402 is in a form of a target design layout, and can be provided as an OPC'ed design layout or provided in the same form as the target design layout prior to performing OPC thereupon. Input data 404 is a list of raw errors from the OPC'ed design layout as generated at step 300 of FIG. 1.

At step 410, error region images corresponding to the list of raw errors are generated from the combination of input data 402 and input data 404. The error region images can be generated, for example, by compiling, i.e., collecting, images around each point in the target design layout that corresponds to the list or raw errors.

If input data 402 is provided as an OPC'ed design layout, the error region images can be generated from the OPC'ed design layout by cropping a region around each point in the OPC'ed design layout that corresponds to the list or raw errors. The size of the cropping can be predefined, or can be determined based on the nature of the corresponding raw error and/or the proximity to any other raw error.

If input data 402 is provided as the target design layout prior to applying OPC, the error region images can be generated from the target design layout prior to applying OPC by applying an OPC algorithm to a region around each point in the pre-OPC target design layout that corresponds to the list or raw errors and thereby generating an OPC'ed region, and subsequently cropping a smaller region around the point that corresponds to the list or raw errors within the OPC'ed region.

The error region images collectively correspond to all raw errors in the list of raw errors as generated at step 300 of FIG. 1. Step 410 can be performed by a computing means configured to accept as inputs a target design layout such as input data 402 and a list of raw errors of the target design layout as generated by an optical rule checks (OPC) program such as input data 404. The computing means can be configured to generate error region images corresponding to the list of raw errors.

At step 435, the error region images generated at step 410 is compared with a library of waivable images, which is provided as input data 412. The library of waivable images is generated at step 100 as discussed above. The library of waivable images can be stored in a data storage unit or in any other medium or device capable of storing data as known in the art. If step 435 is performed by a computing means, the computing means and the data storage unit can be configured to be in communication with each other.

A list of matches between the library of waivable images and the error region images is generated by determining, for each selected error region image, whether any waivable image matches with the selected error region image. If a waivable image matches with the selected error region image, the selected error image is added to the list of matches. If no waivable image matches with the selected error region image, the selected error image is not added to the list of matches.

Step 435 can be performed by the computing means employed for performing step 410. The computing device that is a portion of the computing means and employed to perform step 435 can be the same as, or can be different from, a computing device that is a portion of the computing means and employed to perform step 410. In other words, steps 410 and 435 can be performed by a single computing device in a computing means or by two separate computing devices included in a computing means as a system.

If no matching pair is found between the library of waivable images and the error region images, the process flow proceeds to step 492, in which a list of real errors is set to be the same as the list of raw errors as generated at step 300. In this case, there is no false error within the list of raw errors, and all of the raw errors are real errors that need to be examined for design modifications within the target design layout.

If no matching pair is found between the library of waivable images and the error region images, the process flow proceeds to step 445. At step 445, the grid size of the library of waivable images is compared with the grid size of the error region images. The grid size is the minimum incremental dimension within the grid employed to generate the waivable images or the error region images. If the grid size of the error region images is the same as, or finer than, the grid size of the library of waivable images, the process flow proceeds to step 460. If the grid size of the error region is coarser than the grid size of the library of waivable images, the process flow proceeds to step 450.

Step 445 can be performed by the computing means employed for performing step 410. The computing device that is a portion of the computing means and employed to perform step 445 can be the same as, or can be different from, a computing device that is a portion of the computing means and employed to perform step 435 or step 410.

In a first embodiment, the library of waivable images and the error region images are generated employing the same grid size. In this case, the process flow proceeds from step 445 to step 460. At step 460, a subset of raw errors that correspond to a subset of the list of matches is removed from the list of raw errors to generate a list of real errors.

The subset of the list of matches can be determined, for example, by comparing, within each matching pair of a waivable image and an error region image, a waiver constraint of the waivable image with a corresponding property value, i.e., a value or a set of values for the parameter(s) of the waiver constraint, of the error region image. If the corresponding property value is within the allowed range of the waiver constraint, the matching pair of the waivable image and the error region image is deemed to satisfy a condition for classifying the corresponding raw error as a false error. If the corresponding property value is outside the allowed range of the waiver constraint, the matching pair of the waivable image and the error region image is deemed to satisfy a condition for classifying the corresponding raw error as a true error.

Step 460 can be performed by the computing means employed for performing step 410. The computing device that is a portion of the computing means and employed to perform step 460 can be the same as, or can be different from, a computing device that is a portion of the computing means and employed to perform step 445, 435, or step 410. All raw errors that are not associated with an error region image having a match with a waivable image in the library are classified as real errors.

Referring to step 490, a list of real errors is initially set to the same as the list of raw errors as generated at step 300. Once a raw error is classified as a false error, that raw error is removed from the list real errors. If a raw error is classified as a real error, that raw error is confirmed as a real error, and stays within the list of real errors.

In a second embodiment, the error region images are generated employing a coarser grid size than the library of waivable images. In this case, the process flow proceeds from step 445 to step 450. At step 450, an additional error region image is generated for each error region image within the matching pairs of error region images and waivable images as identified at step 435. Each additional error region image is generated employing the grid size of the library of waivable images.

In the second embodiment, when the process flow proceeds to step 460, a subset of raw errors that correspond to a subset of the list of matches is removed from the list of raw errors to generate a list of real errors. This subset of raw errors is identified by comparing, within each matching pair of a waivable image and an additional error region image, a waiver constraint of the waivable image with a corresponding property value of the additional error region image. Thus, the method of comparison employed in the second embodiment is the same as the method of comparison employed in the second embodiment except that the additional error region images having the same grid size as the library of waivable images and generated at step 450 substitutes the error region images as generated at step 410, which is employed in the first embodiment.

Subsequently, the process flow proceeds to step 490.

Figure 2:
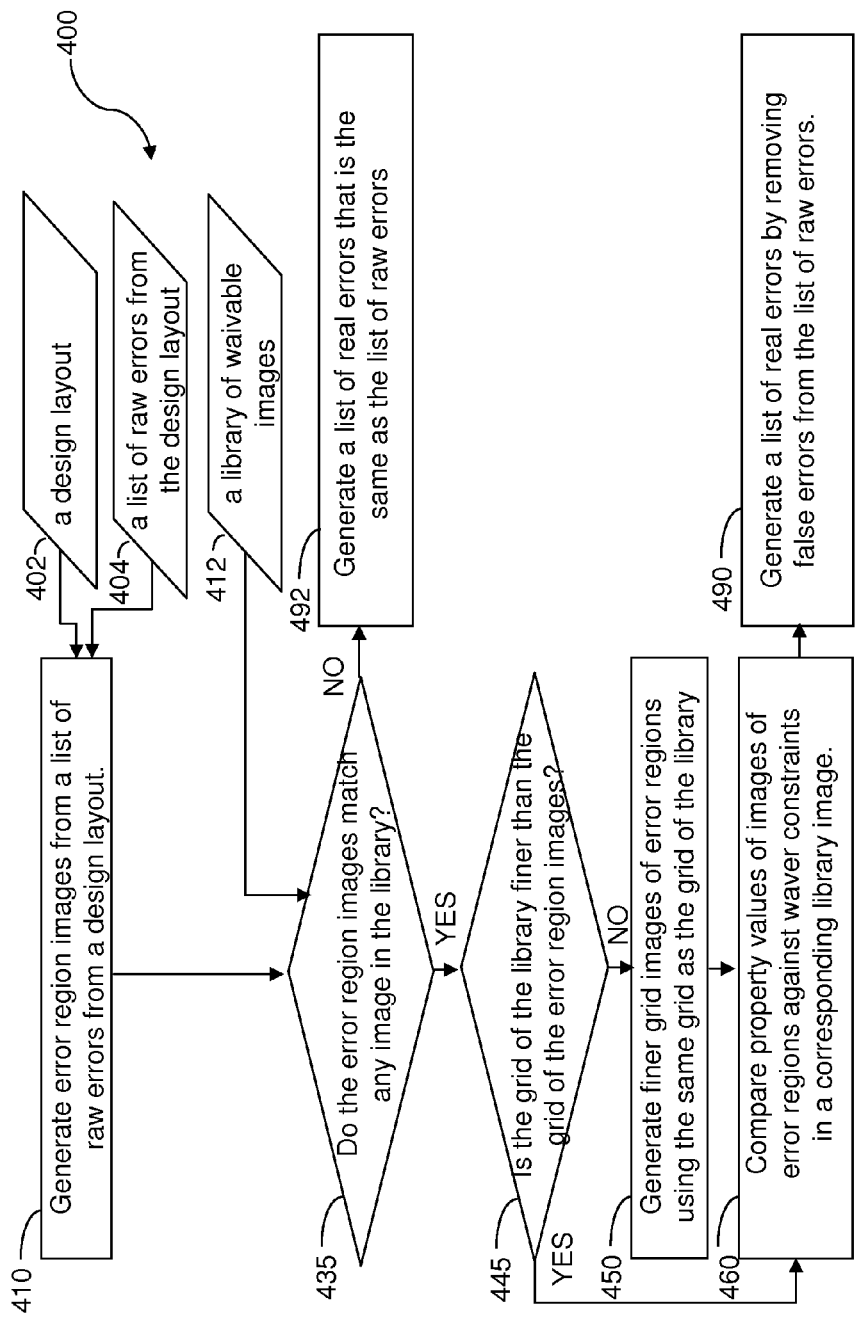
FIG. 2 is a flow chart for performing Remove Waiver Counterparts (RWC) operation according to an embodiment of the present disclosure.

The RWC operation performed at step 400 as illustrated in FIG. 2 allows automatic disposition of patterns that are flagged as raw errors after running an optical rule checks program. Any pattern associated with a raw error is analyzed by comparing the corresponding error region image against the library of waivable images and the corresponding waiver constraints. If the corresponding error region image is determined to match a waivable image and its property value is within the allowed range of the waiver constraint of that waivable image, the raw error is classified as a false error, and is removed from the list of real errors. Thus, design engineers can ignore the false errors, and focus on the list of real errors to more efficiently employ design resources.

Further, the RWC operation can be employed to allow modification of specifications for optical rules for a predefined set of specific patterns that include at least one raw error according to standard optical rules. In this case, the images of the predefined specific patterns are classified as waivable images with corresponding waiver constraints. If any portion of a design layout includes any of the predefined set of specific patterns that violate standard optical rules, raw errors are flagged during an optical rule checks run. However, such raw errors are automatically classified as false errors in the RWC operation, and subsequently removed from the list of real errors. Therefore, a systematic waiver for the specific patterns can be implemented outside the framework of optical proximity correction or optical rules correction.

Figure 3B:
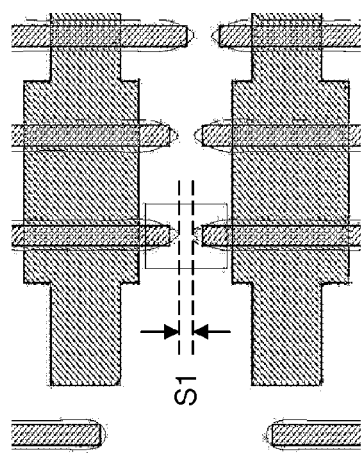
FIG. 3B is a first exemplary error region image according to an embodiment of the present disclosure.
Figure 3C:
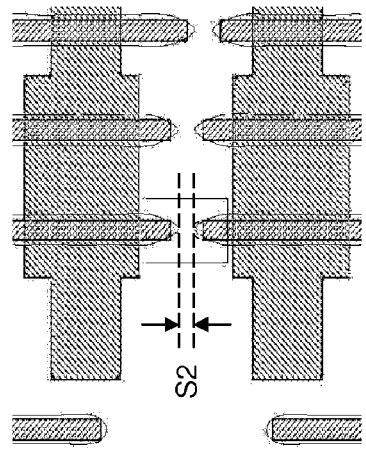
FIG. 3C is a second exemplary error region image according to an embodiment of the present disclosure.
Figure 3A:
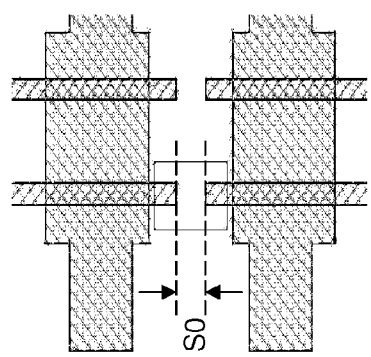
FIG. 3A is an exemplary waivable image according to an embodiment of the present disclosure.

FIGS. 3A-3C illustrate the method employed at step 460 of FIG. 2 to determine whether a raw error, from which an error region image having a match with a waivable image within the library is generated, is a false error or a real error. FIG. 3A shows an example of a waivable image in the library of waivable images. The waivable image is a portion of an OPC'ed reference design layout. The waivable image in FIG. 3A has an exemplary waiver constraint on a property value. For example, the property value can be the distance s0 between two adjacent lines, and the waiver constraint is that distance s0 is within a range defined by a minimum distance value of S_min and a maximum distance value of S_max.

The first exemplary error region image of FIG. 3B is associated with a first raw error of a target design layout. In the first exemplary error region image of FIG. 3B, the property value of the first exemplary error region image is S1, which is between S_min and S_max. Thus, the property value of the first exemplary error region image meets the waiver constraint, i.e., the condition that the property value is between the minimum distance value of S_min and the maximum distance value of S_max. Thus, the first raw error meets the criteria for classification as a false error, and as such, is automatically removed from the list of real errors. The first error is not subsequently reviewed for any modification to the design layout.

The second exemplary error region image of FIG. 3C is associated with a second raw error of the target design layout. In the second exemplary error region image of FIG. 3C, the property value of the second exemplary error region image is S2, which is less than S_min. Thus, the property value of the second exemplary error region image does not meet the waiver constraint, i.e., the condition that the property value is not between the minimum distance value of S_min and the maximum distance value of S_max. Thus, the second raw error does not meet the criteria for classification as a false error, and as such, is classified as a real error, and is kept in the list of real errors. The second error is not subsequently reviewed for modifications to the design layout.

Figure 4:
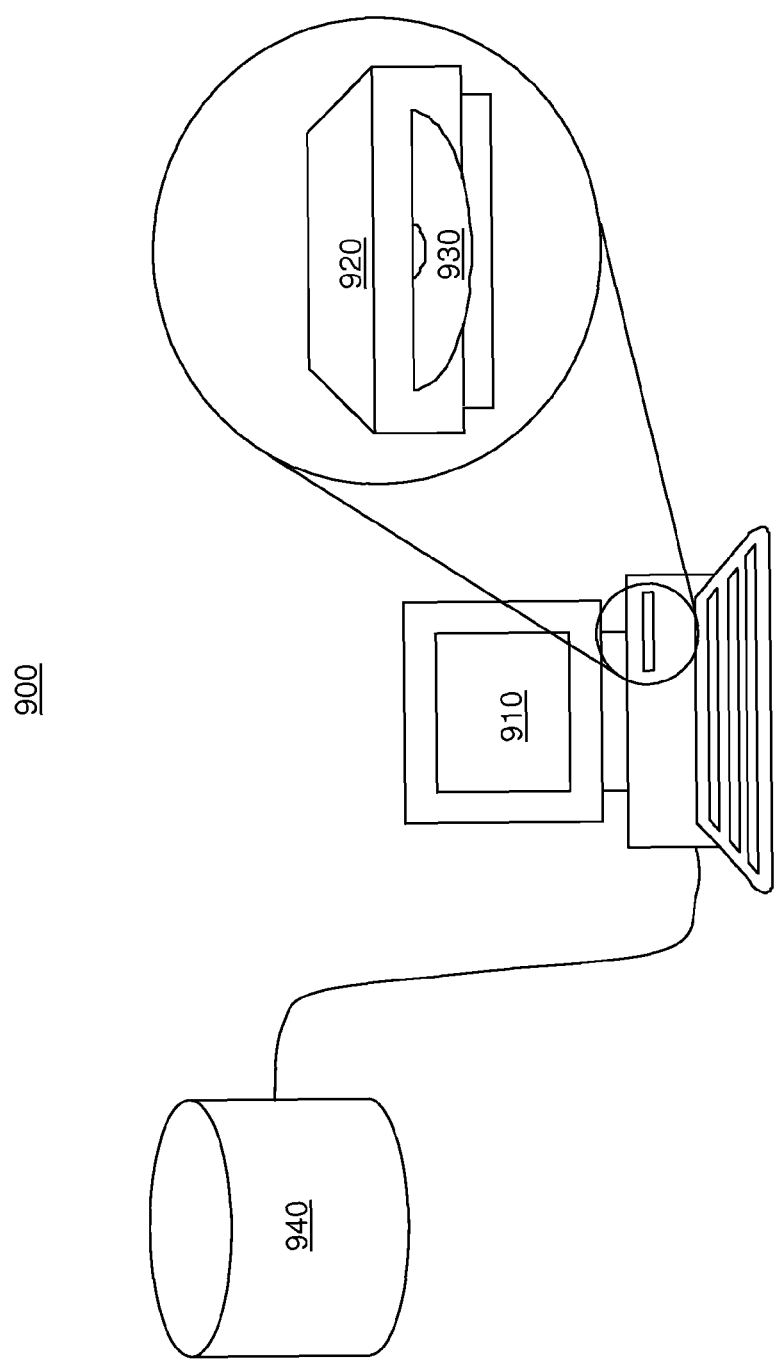
FIG. 4 is an exemplary system for implementing a method of an embodiment of the present disclosure.

Referring to FIG. 4, an exemplary system 900 for implementing a method of an embodiment of the present disclosure is illustrated. The exemplary system 900 includes a computing means 910 including a processor and a memory in communication with the processor, and is configured to perform program instructions. The program instructions can configure the computing means 910 to perform the steps of embodiments of the present invention described above. The exemplary system 900 can be a computer-based system in which the methods of the embodiments of the invention can be carried out by an automated program of machine-executable instructions. The computer-based system includes a processing unit, which is a computing device and houses a processor device, a memory and other systems components (not shown expressly in the drawing) that implement a general purpose or special purpose processing system, or computer that can execute a computer program product. The computing means 910 can be a single computing unit or a plurality of computing units networked together or otherwise in communication among one another.

A data storage unit 940 can store a library of waivable images with corresponding waiver constraints. The data storage unit 940 can be in communication with the computing means 910. A data read/write device 920 can be provided within the computing means 910 or can be in communication with the computing means 910. The data read/write device 920 can be configured to read data from, or write data to, a computer program product, which is a non-transitory machine readable data storage device 930, which can be, for example, a CD ROM, a DVD ROM, an internal or an external hard disk, a portable storage device having an interface such as a USB interface, a magnetic disk, or any other storage medium suitable for storing digital data.

The computer program product can comprise all the respective features enabling the implementation of the inventive method described herein, and which is able to carry out the method when loaded in a computer system. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

For example, the computer program product can be a non-transitory machine-readable data storage medium embodying a program for generating a list of real errors from a list of raw errors, the program including steps of: retrieving a library of waivable images with corresponding waiver constraints from a data storage unit; accepting as inputs a target design layout and a list of raw errors from the target design layout as generated by an optical proximity correction (OPC) program; generating error region images corresponding to the list of raw errors; generating a list of matches between the library of waivable images and the error region images; and removing a subset of raw errors that correspond to a subset of the list of matches from the list of raw errors to generate a list of real errors. Further, the program embodied in the computer program product can include steps that are needed to enable any of the steps described in FIGS. 1 and/or 2.

Further, the result of step 490 or step 492 of FIG. 2 can be output in another computer program product to encode the list of real errors in a machine-readable data format in any non-transitory machine-readable data storage medium known in the art.

EXAMPLE

In a comparative example, an existing ORC run was used to test the efficiency of a prior art method of modifying design layouts that does not employ any pattern matching after generation of raw errors in a design layout. The ORC run had 1138 ORC errors inside SRAM cells. The ORC errors were present across patterns as well as on similar patterns. Usually, if there are similar patterns the property value remains same but in this case the property value depended on the location of these similar patterns. If the pattern was present on an edge of SRAM array, then it was having less strict waiver value than the one which was present in the active region of an array. When these errors were reviewed according to the existing review process, it was found that some of the errors have waivers and some were real errors. It took around about 6 hours to manually review them and this procedure has to be repeated for future ORC reviews of designs containing similar SRAM cells.

In a first exemplary run employing the methods of the present disclosure, the process flow of FIG. 1 was tested for the same ORC run by setting the reference design pattern and the target design pattern the same. First, a pattern library was created which needs to be used by the RWC tool. The creation of this library was done on multiple stages. A single pattern with a specific waiver limit was created in the library. Employing the method of FIG. 2, errors were reduced from 1138 errors to 1049 errors (7.8% reduction).

In a second exemplary run employing the methods of the present disclosure, a bigger pattern library was created with multiple patterns to try to cover most of the waived cases. The resulted pattern library had 10 patterns with varying waiver limits depending on the location of the pattern, as the patterns at the edges had less strict limit than those in the middle or active region. Employing the method of FIG. 2, errors were reduced from 1138 to 243 errors (78.6% reduction).

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method for generating a list of real errors from a list of raw errors, said method comprising:
   generating a library of waivable images with corresponding waiver constraints, wherein each of said waivable images is an image of a region of a reference design layout including a raw error as determined by an optical rule checks (ORC) program and does not require a correction for printability on a photoresist layer;
   generating a list of raw errors by running said ORC program on a target design layout;
   generating error region images corresponding to said list of raw errors;
   generating a list of matches between said library of waivable images and said error region images; and
   removing a subset of raw errors that correspond to a subset of said list of matches from said list of raw errors to generate a list of real errors.

2. The method of claim 1, wherein said library of waivable images and said error region images are generated employing the same grid size.

3. The method of claim 2, wherein said subset of said list of matches is determined by comparing, within a matching pair of a waivable image and an error region image, a waiver constraint of said waivable image with a corresponding property value of said error region image.

4. The method of claim 1, wherein said images of error regions are generated employing a coarser grid than said library of waivable images.

5. The method of claim 4, wherein said subset of said list of matches is determined by:
   generating additional error region images employing a grid size of said library of waivable images; and
   comparing, within a matching pair of a waivable image and an additional error region image, a waiver constraint of said waivable image with a corresponding property value of said additional error region image.

6. The method of claim 1, wherein said corresponding waiver constraint comprises at least one allowed modification to a set of design rules embodied in said ORC program.

7. The method of claim 6, wherein said at least one modification comprises at least one of a minimum spacing between adjacent line shapes, a minimum width of a line shape, a minimum pattern factor within a predefined radius, a maximum spacing between adjacent line shapes, a maximum width of a line shape, and a maximum pattern factor within a predefined radius.

8. The method of claim 1, wherein said error region images are generated by compiling images around each point in said target design layout that corresponds to said list or raw errors.

9. A system for generating a list of real errors from a list of raw errors, said system comprising:
   a data storage unit that stores a library of waivable images with corresponding waiver constraints; and
   a computing means in communication with said data storage unit and configured to accept as inputs a target design layout and a list of raw errors of said target design layout as generated by an optical rule checks (OPC) program, and configured to generate error region images corresponding to said list of raw errors, and configured to generate a list of matches between said library of waivable images and said error region images, and configured to remove a subset of raw errors that correspond to a subset of said list of matches from said list of raw errors, and configured to output, in a data storage medium, a list of real errors that is a difference between said list of raw errors and said subset of raw errors.

10. The system of claim 9, wherein said data storage unit is configured to store said library of waivable images using a grid size, and said computing means is configured to generate said error region images using said grid size.

11. The system of claim 10, wherein said computing means is configured to determine said subset of said list of matches by comparing, within a matching pair of a waivable image and an error region image, a waiver constraint of said waivable image with a corresponding property value of said error region image.

12. The system of claim 9, wherein said data storage unit is configured to store said library of waivable images using a first grid size, and said computing means is configured to generate said error region images using a second grid size that is coarser than said first grid size.

13. The system of claim 12, wherein computing means is configured to determine said subset of said list of matches by:
   generating additional error region images employing a grid size of said library of waivable images; and
   comparing, within a matching pair of a waivable image and an additional error region image, a waiver constraint of said waivable image with a corresponding property value of said additional error region image.

14. The system of claim 9, wherein said corresponding waiver constraint comprises at least one modification to a set of design rules embodied in said OPC program.

15. The system of claim 14, wherein said at least one modification comprises at least one of a minimum spacing between adjacent line shapes, a minimum width of a line shape, a minimum pattern factor within a predefined radius, a maximum spacing between adjacent line shapes, a maximum width of a line shape, and a maximum pattern factor within a predefined radius.

16. The system of claim 9, wherein said computing means is configured to generate said error region images by compiling images around each point in said target design layout that corresponds to said list or raw errors.

17. A non-transitory machine-readable data storage medium embodying a program for generating a list of real errors from a list of raw errors, said program comprising steps of:
   retrieving a library of waivable images with corresponding waiver constraints from a data storage unit;
   accepting as inputs a target design layout and a list of raw errors from said target design layout as generated by an optical proximity correction (OPC) program;
   generating error region images corresponding to said list of raw errors;
   generating a list of matches between said library of waivable images and said error region images; and
   removing a subset of raw errors that correspond to a subset of said list of matches from said list of raw errors to generate a list of real errors.

18. The non-transitory machine-readable data storage medium of claim 17, wherein said program is configured to generate said error region images employing a same grid size as a grid size of said library of waivable images.

19. The non-transitory machine-readable data storage medium of claim 18, wherein said program determines said subset of said list of matches by comparing, within a matching pair of a waivable image and an error region image, a waiver constraint of said waivable image with a corresponding property value of said error region image.

20. The non-transitory machine-readable data storage medium of claim 17, wherein said program is configured to generate said error region images employing a coarser grid size as a grid size of said library of waivable images, and said program determines said subset of said list of matches by:
   generating additional error region images employing a grid size of said library of waivable images; and
   comparing, within a matching pair of a waivable image and an additional error region image, a waiver constraint of said waivable image with a corresponding property value of said additional error region image.

* * * * *